United States Patent [19]

Akiyama et al.

[11] Patent Number: 4,938,598
[45] Date of Patent: Jul. 3, 1990

[54] METHOD AND APPARATUS FOR POSITION DETECTION ON REDUCTION-PROJECTION SYSTEM

[75] Inventors: Nobuyuki Akiyama; Yoshihiko Yamauchi, both of Yokohama, Japan

[73] Assignee: Hitachi, Ltd., Tokyo, Japan

[21] Appl. No.: 200,911

[22] Filed: Jun. 1, 1988

[30] Foreign Application Priority Data

Jun. 5, 1987 [JP] Japan .................................. 62-139740
Feb. 10, 1988 [JP] Japan .................................. 63-27501

[51] Int. Cl.$^5$ .............................................. G01B 11/00
[52] U.S. Cl. ....................................... 356/375; 250/548; 356/400; 356/401
[58] Field of Search ............... 356/375, 399, 400, 401; 250/548

[56] References Cited

U.S. PATENT DOCUMENTS 4,355,892 10/1982 Mayer et al. ..................... 356/401
4,779,986 10/1988 Nakashima et al. ............... 356/401
4,798,962 1/1989 Matsumoto et al. ............... 356/401

*Primary Examiner*—F. L. Evans
*Attorney, Agent, or Firm*—Antonelli, Terry, Stout & Kraus

[57] ABSTRACT

The present invention is of an apparatus, in a reduction-projection exposure apparatus, for reduction-projection position detection comprising illuminating means for illuminating a registration mark on a specimen with three or four wavelengths of laser beams oscillated in an Ar laser and one or two wavelengths, which are different from the aforesaid wavelengths, of laser beams oscillated in a He-Ne laser passed through a reduction-projection lens, an image forming optical system condensing, through the reductio-projection lens, reflected beams from the the registration mark on the specimen illuminated by the illuminating means and separating the beams into beams of four wavelengths, at least, out of the aforesaid wavelengths, for forming images of the separated beams, and image pick-up means for picking up the images, formed by the image forming optical system, of the registration mark on the specimen, thereby to detect the position of the registration mark, and of a relative method thereto.

12 Claims, 9 Drawing Sheets

FIG. 7(a) g-LINE+ h-LINE

FIG. 7(b) g-LINE+ e-LINE

FIG. 7(c) h-LINE+ d-LINE

FIG. 7(d) g-LINE+h-LINE +e-LINE

METHOD AND APPARATUS FOR POSITION DETECTION ON REDUCTION-PROJECTION SYSTEM

BACKGROUND OF THE INVENTION

The present invention relates to a method and apparatus for detecting registration mark on a wafer for alignment, and more particularly to a method and apparatus for reduction-projection position detection on a TTL (Through The Lens) system for use in a laser exposure apparatus using excimer laser beam of narrow wavelength band.

Figure 13:
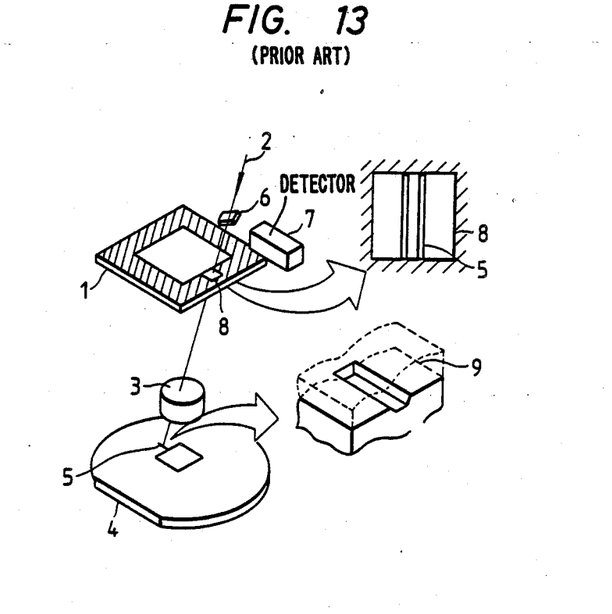
FIG. 13 is a drawing showing a prior art reduction-projection mask aligner.

A lens for a projection exposure apparatus is difficult to be compensated for chromatic aberration and the lens has hitherto been designed and put to practical use on the assumption that the exposure is made using single wavelength light. Therefore, light of single wavelength must have been used also for illumination in detecting the registration mark. A state of illumination and detection in action will be described with reference to FIG. 13. Single-wavelength illuminating light 2 is projected from above a mask 1 to illuminate, through a reduction-projection lens 3, a registration mark 5 on a wafer 4. Reflected light therefrom is reflected by a half mirror 6 and detected by a detector 7. FIG. 13 shows an image detected by the detector 7, wherein the registration mark 5 is seen within a window 8 in the mask. As apparent from the enlarged view of the registration mark, resist 9, which is required for pattern formation, is spread over the registration mark.

Figure 14:
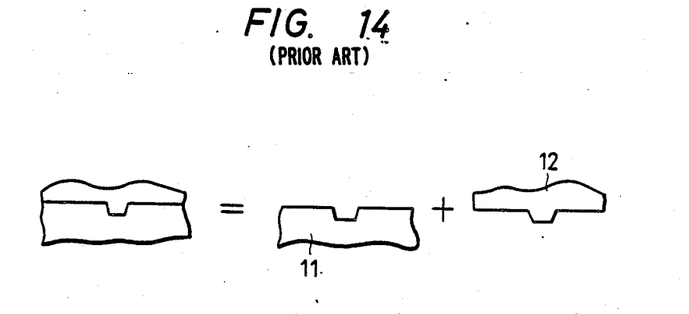
FIG. 14 is a drawing for explaining a technical problem in the prior art.

The cross section of the part in question, as shown in FIG. 14, can be studied after being imaginarily separated into a mark portion 11 and a resist portion 12. The light of single wavelength illuminating the resist portion from above causes interference therein. The interfered light will be uniform if the resist has an even thickness. In practice, however, there is present unevenness on the resist due to unevenness on the surface of the mark, and therefore, the interfered light therein becomes irregular. Thus, there has been a problem that the accuracy in the detection of the mark is thereby lowered.

To solve this problem, an art disclosed in Japanese Laid-open patent publication No. 60-80223 used light of two wavelengths selected from emission lines (lines of remarkably bright light) included in light from a mercury lamp, i.e., h-line (of 405 nm wavelength), g-line (of 436 nm wavelength), e-line (of 546 nm wavelength), and d-line (of 577 nm) as the illuminating light, and reduced the effect of the unevenness on the resist by summing up then obtained results. Detection signals obtained when the e-line and d-line were used for the illumination and the summed up signal thereof are shown as an example in FIG. 15, from which it is known that both ends 13 of the mark 5 were symmetrically detected by summing up the two signals and the effect of the unevenness of the resist was reduced.

Figure 16:
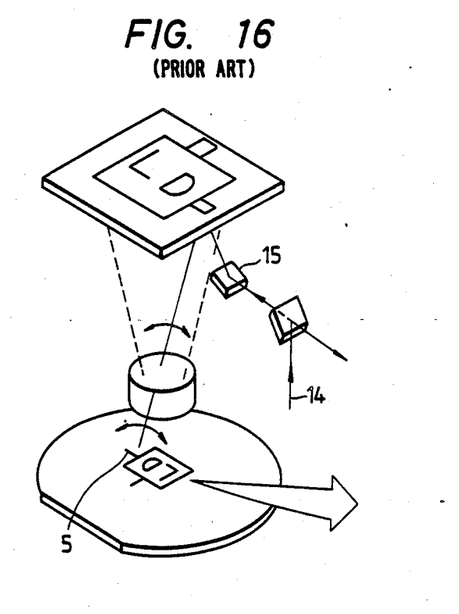
FIG. 16 is a drawing showing another example of a prior art reduction-projection mask aligner.
Figure 17:
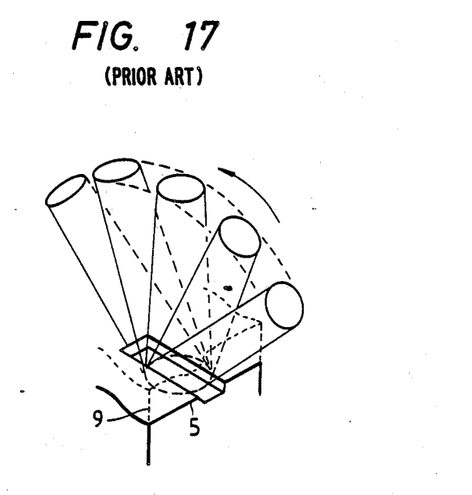
FIG. 17 is a drawing showing in enlarged scale swung illumination in the example shown in FIG. 16.

In place of the aforesaid method, there was disclosed another method in Japanese Laid-open Pat. No. 60-136312 using seemingly different wavelengths of light for the illumination and summing up the detected signals. In this method, as shown in FIG. 16, a laser beams 14 having a high rectilinear propagating property was used as the illuminating light, and a reflecting mirror 15, which was inserted in the way of illumination, was caused to swing so that the illuminating light was swung about the registration mark 5 being taken as the center of the swinging. This method utilized the change in the optical path length within the resist 9 produced by the swinging as shown in FIG. 17.

The excimer laser used in the present invention is a narrow band laser beam of 249 nm wavelength (other than this, there are those of 193 nm, 308 nm, and 351 nm wavelengths). The reduction-projection lens applied to it is not at all compensated for chromatic aberration, and therefore, it can be used only for a laser beam. The quantity of chromatic aberration in general is extremely great. The image forming position 21 in FIG. 16 is caused to shift about 4 nm by 1 nm change in the wavelength. Since the band of the emission lines (h-, g-, e-, and d-lines) of the light from the mercury lamp is 1 to 2 nm thick or above, the information forming position shifts as large as 4 to 8 nm, and therefore, they cannot be used for detection of the registration mark.

Figures 7A, 7D:
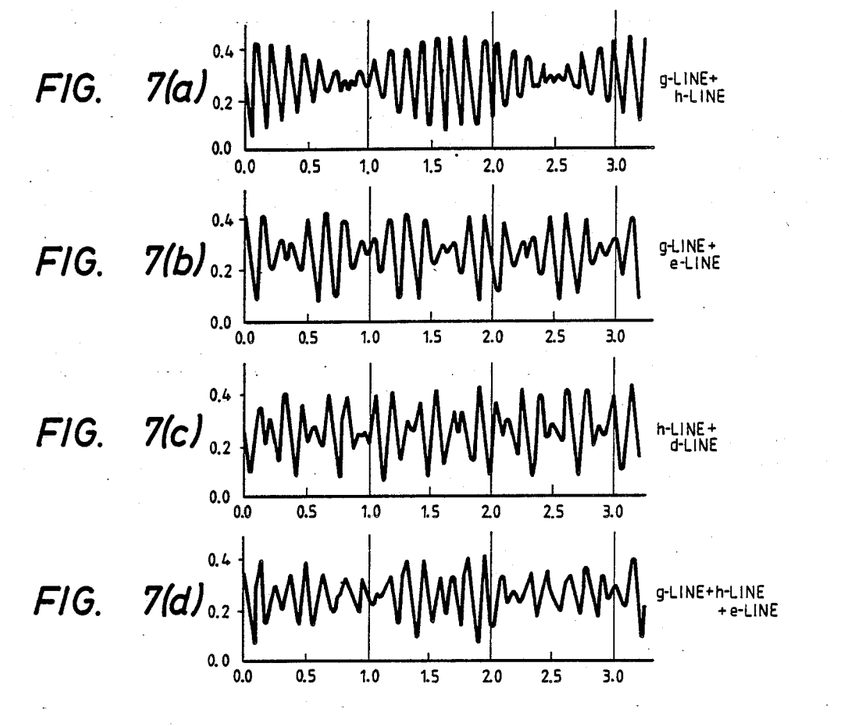

Then, even if the emission lines from the mercury lamp were used, the range within which the effect of the uneven thickness of the resist is kept low is from 0.9 to 1.4 $\mu$m as described above with reference to FIG. 15, and so, in the case the resist thickness is outside the range, the reflected light will show a great periodical variation. While the case where e-line and d-line were used for the illumination was shown in FIG. 15, other cases, that is, g-line+h-line, g-line+e-line, h-line+d-line, and g-line+h-line+e-line were used as shown in FIG. 7. It shows that only the use of g-line+h-line was effective against change in the thickness from 0.7 to 1.0 $\mu$m, but the rest were not at all effective. Various other combinations were tried but found to be ineffective at all.

As described above, the prior art cannot be applied to the reduction-projection lens designed for excimer laser beam, and has no sufficient effect against the change in the thickness of the resist.

SUMMARY OF THE INVENTION

An object of the present invention is to solve the above mentioned problems and to provide a method and apparatus for reduction-projection position detection applicable to a reduction-projection lens designed for excimer laser beam and capable of coping with unevenness in the thickness of the resist and thereby accurately detecting registration marks on a specimen and achieving high precision alignment.

Another object of the present invention is to provide a method and apparatus for reduction-projection position detection, in which initial adjustments of image forming optical systems for plural wavelengths are made easy, and which is steady for a long time, or hardly exhibits a change with the passage of time, and capable of obtaining a highly reliable detection image of the registration mark.

The aforementioned object is achieved by providing, in a reduction-projection mask aligner, illuminating means for illuminating a registration mark on a specimen with three or four different wavelengths of laser beams oscillated in an Ar laser and one or two wavelengths, which are different from the aforesaid wavelengths, of laser beams oscillated in a He-Ne laser passed through a reduction-projection lens, an image forming optical system condensing, through the reduction-projection lens, reflected beams from the registration mark on the specimen illuminated by the illuminating means and separating the beams into beams of four wavelengths, at least, out of the aforesaid wavelengths, and further, having the optical paths of the separated beams bent by means of combinations of mirrors so as to change their optical path lengths, for forming images of the separated beams on the same plane, and image pick-up means for picking up the images formed by the image forming optical system of the registration mark on the specimen, thereby to detect the position of the registration mark.

That is, when there is a difference of 30 nm or so between wavelengths, the images are formed at an interval of 120 nm. In order to form such images at the same position, beams of four wavelengths, at least, are separated by means of dichroic mirrors disposed in the optical path, their respective optical path lengths are shortened by means of convex lenses, for example, and the beams are then combined again, whereby the image of the registration mark is formed at the same position. Then the image is further magnified to be detected and the aforesaid object is thereby achieved.

The aforesaid another object is achieved by such arrangement not to combine again the four single-wavelength beams once separated by means of the dichroic mirrors but to dispose magnifying lenses in the respective optical paths and dispose individual image pick-up elements at the positions of the respective images. Then, signals obtained from these image pick-up elements are compensated for their positions by processing of digital signals thereof to be then added together, whereby the same effect as optically summing up the images can be obtained and the adverse effect by interference within the photoresist can be removed.

Figure 8:
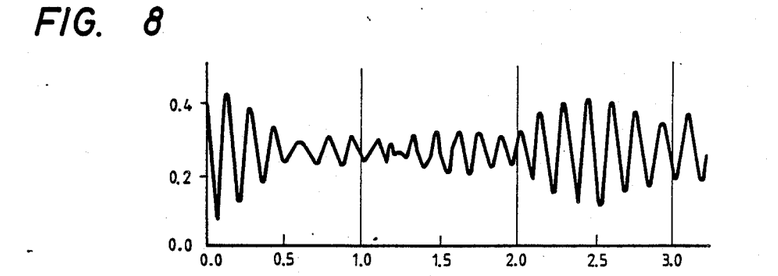
FIG. 8 is a diagram showing a condition of interference occurring within the resist when four laser beams according to the present invention were projected thereon.
Figure 15:
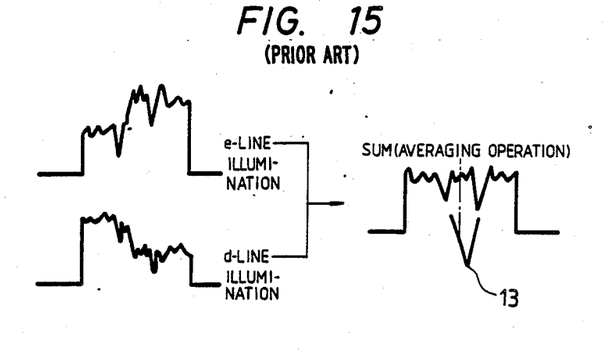
FIG. 15 is a diagram for explaining a prior art.

That is, the present invention is characterized in that beams obtained from an Ar laser oscillator of wavelengths 458 nm, 488 nm, and 515 nm and the beam obtained from a He-Ne laser oscillator of a wavelength of 543 nm are used as the four laser beams at least. In order to reduce the adverse effect of the interference within the resist, use of laser beams with a large number of wavelengths is preferable. But, the wavelengths obtainable from laser oscillators are limited and small in number. In the present case, the four laser beams having wavelengths at intervals of approximately 30 nm as mentioned above are used for the detection. A result of reflected beams obtained in such a case through a method similar to that used in the cases of FIG. 15 and FIG. 7 is shown in FIG. 8.

Figure 5:
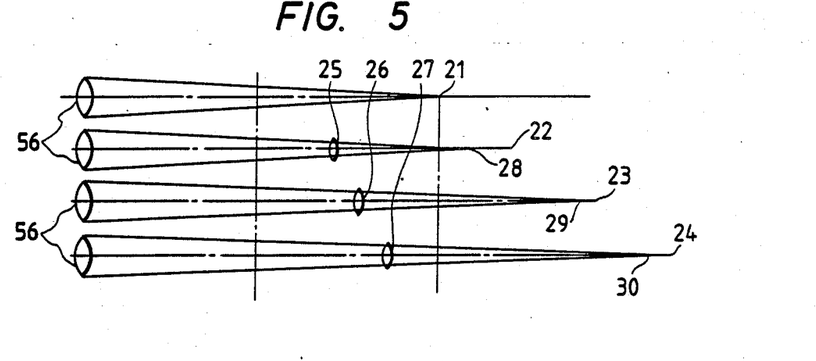
FIGS. 5 and 6(a) and (b) are drawings for explaining principle of the reduction-projection mask aligner of the present invention.

The images obtained by the wavelengths 458 nm, 488 nm, 515 nm, and 543 nm are formed as shown in FIG. 5 at the points 21, 22, 23, and 24, respectively, and their magnifications are also different. To equalize all the magnifications, convex lenses being calculated focal lengths are disposed at the positions 25, 26, and 27, whereby desired images are formed at the points 28, 29, and 30. By constructing a wavelength separating-combining optical system, as shown in FIG. 6, of a dichroic mirror 31 having a transmissivity 41 (a mirror formed of a multi-layer evaporated film transmitting light of wavelengths below 458 nm and reflecting light of wavelengths above 488 nm), a dichroic mirror 32 having a transmissivity 42, a dichroic mirror 33 having a transmissivity 43, and a total reflection mirror 34, and arranging such that the aforesaid convex lenses are inserted in the optical paths 36, 37, and 38 for the wavelengths 488 nm, 515 nm, and 543 nm, respectively, images of the same magnifications can be formed at the point 44.

Figure 10:
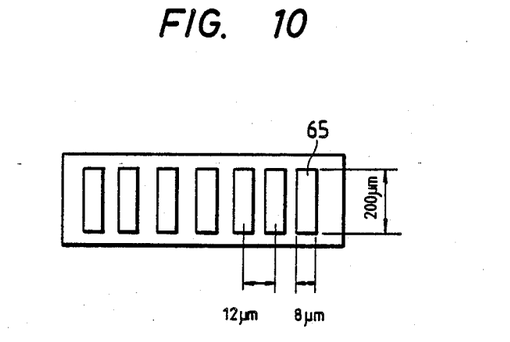
FIG. 10 is a drawing for explaining a one-dimensional linear image sensor for use in the present invention.

The image pick-up element is constructed as shown in FIG. 10 as a one-dimensional linear image sensor formed of a group of photodiodes whose photosensitive portions each having an area of approximately 8 $\mu m \times 200$ $\mu m$ and arranged at pitches of 12 $\mu m$. The sampling interval of the detection image of the registration mark on the wafer must be less than 0.25 $\mu m$ in view of the detection tolerance, and therefore, the registration mark on the wafer must be magnified approximately 50 times ($12/0.25 \approx 50$) for forming its image on the one-dimensional image sensor. Since the magnification of the reduction-projection lens 20 is five, lenses having a magnification of ten must be used for the magnifying lenses 91 to 94.

Figure 6A:
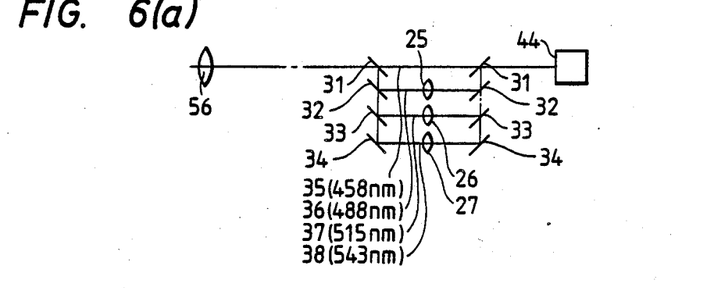
Figure 6B:
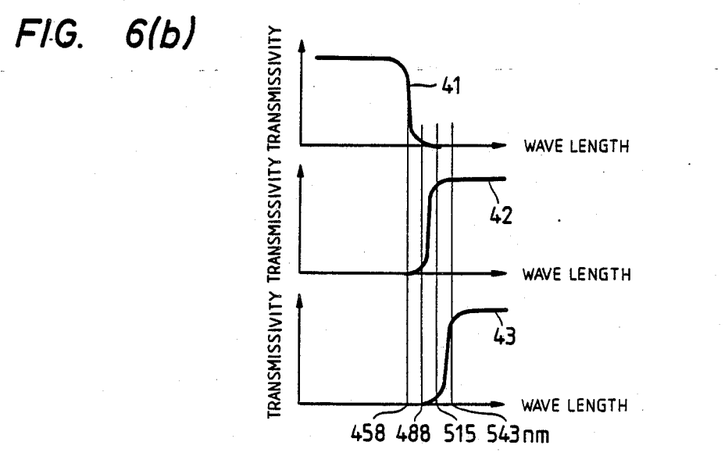
Figure 9:
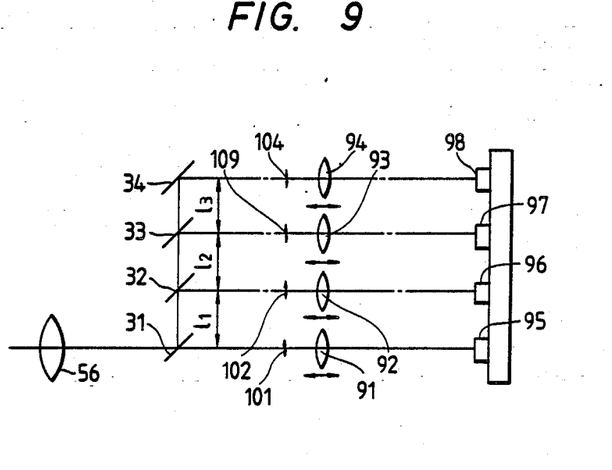
FIG. 9 is a drawing for explaining principle of an optical system compensating for chromatic aberration according to the present invention.

Since image forming magnifications are varied according to the illuminating wavelengths as described in FIG. 6(a), the variations must be corrected. In the present invention, the magnifications are adapted to be adjusted by moving the positions of the magnifying lenses 91 to 94 longitudinally thereby to change the distances between the lenses and the first real images and between the same and the one-dimensional linear image sensors 95 to 98. Further, the positions of the first real images 61 to 64 along the optical axes are made best suited by changing the distances $l_1$, $l_2$, and $l_3$ as shown in FIG. 9.

BRIEF DESCRIPTION OF THE DRAWINGS

FIGS. 1(a) and (b) are schematic organizational drawings showing an embodiment of a reduction-projection mask aligner according to the present invention;

FIGS. 7(a)-(d) are diagrams showing conditions of interference occurring within the resist caused by laser beams having various wavelengths;

DETAILED DESCRIPTION OF THE PREFERRED EMBODIMENTS

An embodiment of the present invention will be described below with reference to FIG. 1. S-polarized (first linearly polarized) laser beams from an Ar laser 51 simultaneously oscillating wavelengths of 458 nm, 488 nm, and 515 nm and S-polarized (first linearly polarized) laser beam from a He-Ne laser 52 oscillating a wavelength of 543 nm are combined by means of a dichroic mirror 53 to be led to a polarized beam splitter 54. The polarized beam splitter 54 is such that reflects the S-polarized laser beam in the direction at a right angle to the incident beam, while it transmits P-polarized light (second linearly polarized light perpendicular to the first linearly polarized light). The light is reflected by the polarized beam splitter 54 to the left, passed through a quarter wave board 55, and caused to illuminate a registration mark 58 on a wafer 57 through a reduction-projection lens 56. The registration mark 58 as shown in FIG. 2 in detail is disposed inside or in the vicinity of a chip and is made up of a mark in the x direction 60 and mark in the y direction 61. Reflected light from the registration mark 58 is passed through the reduction-projection lens 56 and led to the quarter wave board 55 again to be turned into a P-polarized laser, and rectilinearly advanced passed through the polarized beam splitter 54 and separated into a mark detection system in the x direction 63 and a mark detection system in the y direction 64 by means of a half mirror 62.

Figures 1A, 1B:
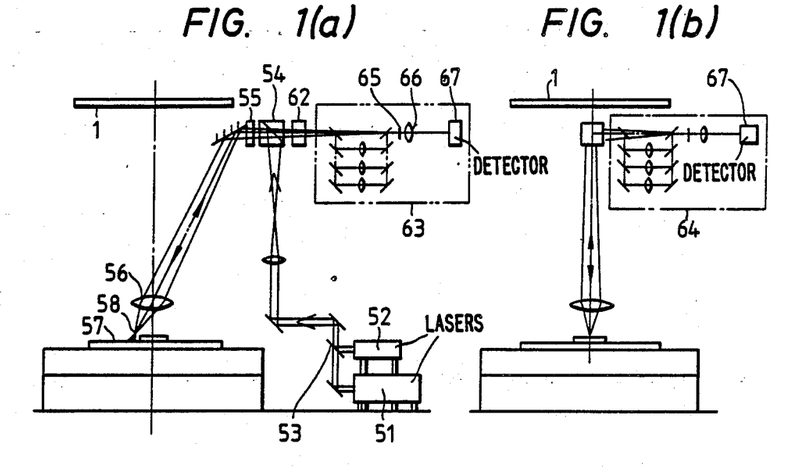
Figure 2:
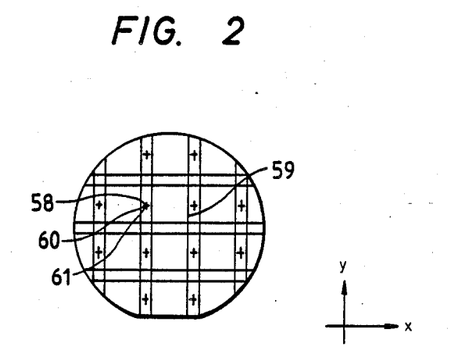
FIG. 2 is a drawing showing registration marks on a wafer.

The mark detection system in the x direction 63 has incorporated therein with an optical system for compensating for different image forming positions and different magnifications caused by the wavelengths of 458 nm, 488 nm, 515 nm, and 545 nm as was described in FIG. 6, and by means of this, images produced by illumination with light of four wavelengths are formed at a point 65 in FIG. 1. The reduction-projection lens 56 has a magnification of five against the wavelength of 249 nm (excimer laser beam) and have magnifications of about seven against the wavelengths of 458 nm, 488 nm, 515 nm, and 545 nm, and therefore, the image 65 is also magnified about seven times. Since magnification to a degree of about 50 times is required for detection, the image is further magnified by means of a magnifying lens 66 and its desired image is formed on a detector (image pick-up means) 67.

Figure 3A:
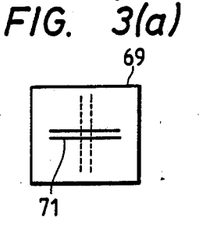
FIGS. 3(a) and (b) are drawings showing images picked up by detectors shown in FIG. 1 and displayed on monitors.
Figure 3B:
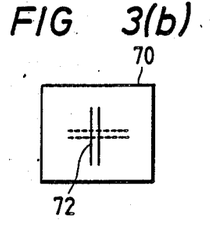

Generally, the image forming positions of the mark in the x direction 60 and the mark in the y direction 61 are different from each other due to astigmatism of the reduction-projection lens 56. Therefore, the mark detection system in the y direction 64 is also provided similarly to the mark detection system in the x direction 63, and the image is converted by a detector (image pick-up means) 68 into a picture signal, which is subjected to a predetermined operational process so that the image position is detected. The detection results are shown in FIGS. 3(a) and 3(b). From a monitor 69 of the detector (image pick-up means) 67, a displayed mark in the x direction 71 can be clearly detected as a picture signal, while from a monitor 70 of the detector (image pick-up means) 68, a displayed mark in the y direction 72 can be clearly detected as a picture signal, whereby the position in the y direction can be obtained from the mark in the x direction and the position in the x direction can be obtained from the mark in the y direction.

Figure 4:
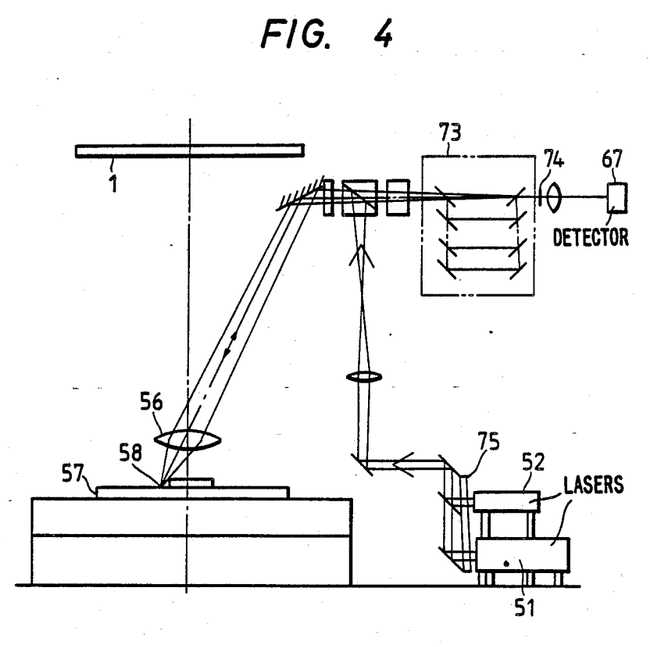
FIG. 4 is a schematic organizational drawing showing another embodiment of a reduction-projection mask aligner according to the present invention.

Now, a second embodiment will be described. When, in FIG. 6, the optical paths 35, 36, 37, 38 are arranged so close to each other that it is impossible to disposed the convex lenses therein, the convex lenses are removed and an optical path length compensating mechanism 73 as shown in FIG. 4 is disposed in the optical paths, instead. Then, images whose magnifications are different dependent on the respective wavelengths (458, 488, 515, 543 nm) are formed at a position 74. There is disposed a wavelength selecting mechanism 75 (which is easily formed of an interference filter or a diffraction grating) just at the back of the laser oscillators 51, 52, whereby the wavelength 458 nm is first selected for illumination so that an image is converted by means of the detector 67 into a picture image, which is subjected to a predetermined operational process to detect the position of the image, and then the wavelength 488 nm is selected for illumination, and its image is similarly converted into a picture image, which is subjected to the predetermined process to detect the position of the image, and thus, such sequential operations will be repeated four times in all to obtain a satisfactory result. This method requires four times as long detection time as that required in the first embodiment, but four detection images through illumination of four wavelengths can be obtained independently of one another, and therefore an advantage is obtained that when these images are to be combined, the compensation for magnification and normalization of each image can be executed at will on a computer.

Another embodiment of the present invention will be described below with reference to FIG. 11. In the present reduction-projection exposure apparatus, light from a mercury lamp 81 is reflected by a parabolic mirror 82, condensed by a condenser lens 83, illuminates a reticle 1, and forms a chip 59 on a wafer 57 by means of a reduction-projection lens 56.

For detection of the registration mark 58 on the wafer, laser beams from Ar laser 51 oscillating wavelengths of 458 nm, 488 nm, and 515 nm at the same time and a laser beam from a He-Ne laser 52 oscillating a wavelength of 543 nm are combined by means of a dichroic mirror 53. Then, while a portion of the beam is branched off by a half mirror 74 into another illuminating system, the main beam is reflected by another half mirror 54 to illuminate a linear registration mark 60'. Reflected beam from the uneven registration mark 60' passes through the original path and reaches the half mirror 54 but penetrates it and reaches a chromatic aberration compensating mechanism. As described in FIG. 9, four laser beams are separated by dichroic mirrors 31 to 34 and their respective first real images are formed at positions on points 101 to 104. The same are further magnified by lenses 91 to 94 whose magnifications are ten, whereby their second real images are formed on one-dimensional linear image sensors 95 to 98. At this time magnitudes of the second real images can be made equal by adjusting the distances between optical axes ($l_1$, $l_2$, $l_3$ described in FIG. 9) and the positions in the longitudinal direction of the magnifying lenses 91 to 94.

While the foregoing description was of an optical system 100Y for detecting a linear registration mark 60' in the Y direction for measuring the position in the Y direction, an optical system for detecting a linear registration mark 61' in the X direction must also be provided. Reference numeral 100X in FIG. 11 is the optical system for detecting the position in the X direction.

Figure 12:
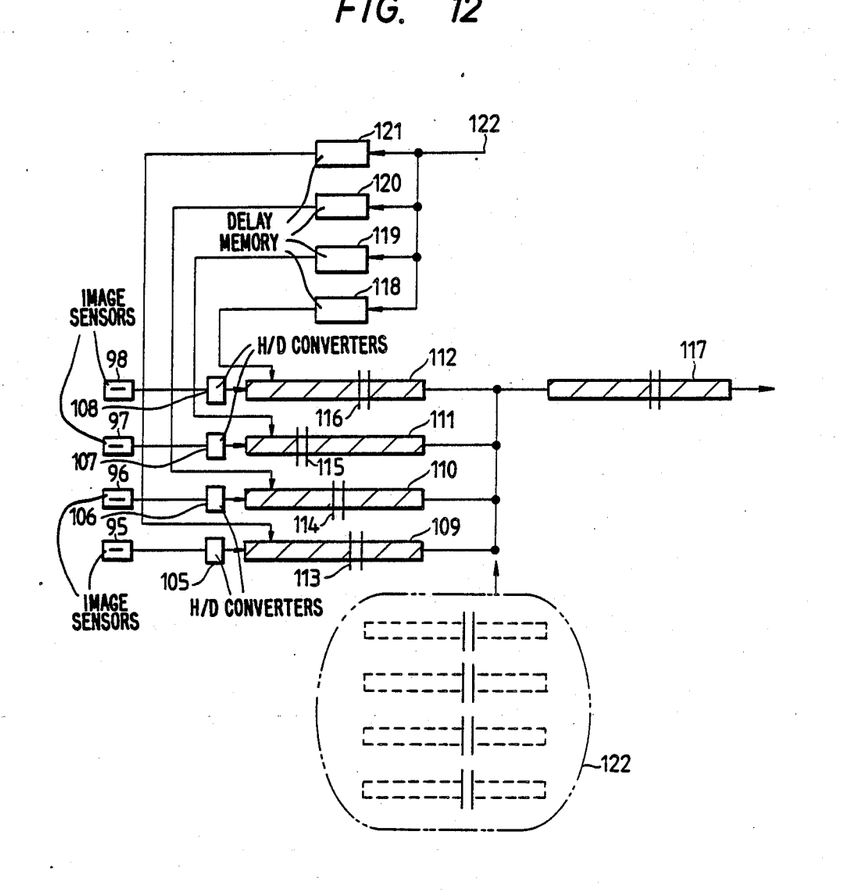
FIG. 12 is an organizational drawing of a signal processing circuit constituting a section of the present invention.

Output signals of the one-dimensional linear image sensors 95 to 98 are converted into digital signals by means of A/D converters 105 to 108 and stored in one-dimensional memories 109 to 112. In the memory 109 is stored the image of the registration mark detected with the wavelength of 458 nm, in the memory 110 is stored the image of the registration mark detected with the wavelength of 488 nm, in the memory 111 is stored the image of the registration mark detected with the wavelength of 515 nm, and in the memory 112 is stored the image of the registration mark detected with the wavelength of 543 nm. These images have positional slippages caused by adjustment errors in the dichroic mirrors 31 to 34, and therefore, the second real images of the registration mark 58 (60') are formed at positions 113 to 116 in the one-dimensional memories.

These points must be in the same positions in the one-dimensional memories, but it is difficult to move the positions of the real images of the registration mark by mechanical adjustments of the optical systems. Here, a method to substantially move the positions of the real images of the registration marks by changing the timing of reading out the images from the one-dimensional memories will be described.

Figure 11:
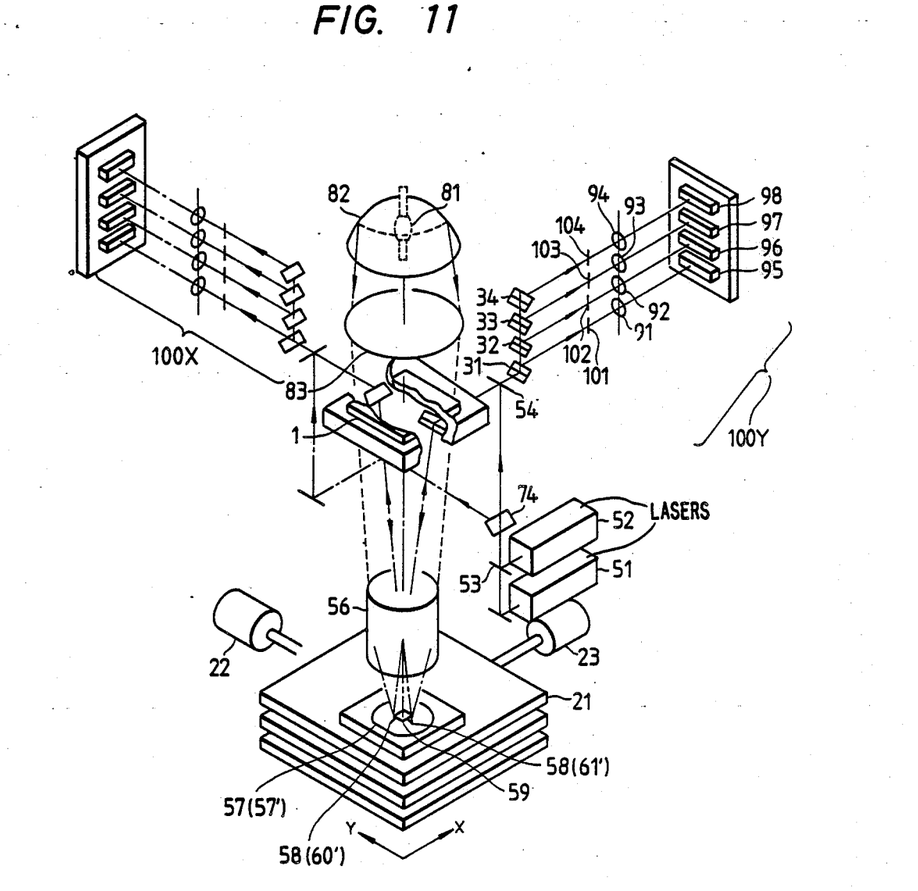
FIG. 11 is an organizational drawing showing a detection system of a reduction-projection mask aligner of the present invention.

First, in FIG. 11, a wafer 57' with no resist spread thereover is set up on the X-Y stage 21, and a linear registration mark is detected in the above described manner. Then, in FIG. 12, the positions of the real images 113 to 116 of the registration mark on the one-dimensional memories 109 to 112 are displayed as numbers of bits counted from the left-hand ends of the one-dimensional memories by means of such a device as a synchroscope or counter, not shown, so that the numbers of the bits are obtained by visual observation. Thereafter, taking the position of the real image 113 of the registration mark as reference, the positions of the other real images 114 to 116 are subtracted therefrom, and the differences are obtained in units of bit numbers of the memories. The thus obtained values of mutual positional variances of the real images 113 to 116 of the registration mark expressed in units of bit numbers of the memories can be previously stored in the delay memory circuits 118 to 121 shown in the drawing. The foregoing process is required to be carried out only once when the present apparatus is installed in the field of production.

Now, description will be made of the operation for actually detecting the registration mark. In order to read the signals from the one-dimensional memories 113 to 116 described above with reference to FIG. 12, a memory contents read pulse 122 is supplied to such a memory, and thereby, the contents of the one-dimensional memory are read out from its left-hand bit by bit. Therefore, by changing the timing of supply of the pulse to each of the one-dimensional memories 113 to 116, the timing of reading is also changed.

In the present invention, the timing of the pulses is changed corresponding to the values stored in the aforesaid delay memory circuits 118 to 121, and such memory contents read pulses 122 are supplied to the respective one-dimensional memories. By so doing, a signal 122 in which the mutual positional variances are corrected is supplied to a four-image composite signal storage memory 117, wherein the contents of the one-dimensional memories 113 to 116 are summed up, and thereby, the above described second real image at the time the registration mark 60' is illuminated by four wavelengths can be obtained.

Incidentally, the one bit of the memory shown in FIG. 12, in reality, is formed of eight bits, whereby the analog signal converted into a digital signal having 256 gradations is processed in the aforesaid operation.

According to the present invention as described so far, such effects are obtained that illumination by laser beams has become possible, and even when the reduction-projection lens for excimer laser beam is used, correct detection of the position of the registration mark on the specimen (wafer) through that reduction-projection lens has become possible, and further, the adverse effect of unevenness of the resist spread over the wafer has been removed practically completely and the detection accuracy of the registration mark, which in the past was 0.3 to 0.4 $\mu$m, has been improved to the level of 0.1 $\mu$m of the detection accuracy.

Specifically, since overall alignment accuracy of $\pm 0.15$ $\mu$m or less is required in the exposure process of an LSI of a gate length of 0.5 $\mu$m, it is absolutely necessary to keep the detection accuracy of the registration mark below $\pm 0.1$ $\mu$m, from which the significance of the effect of the present invention will be understood.

And, according to the present invention, by virtue of the use of four-wavelength laser beams for the illumination, the adverse effect of the uneven spreading of photoresist over the wafer has come to be eliminated, and thereby the detection tolerance of the registration mark which in the past was 0.2 to 0.4 $\mu$m has been reduced to below 0.05 $\mu$m.

Further, in the present invention, the four-wavelength beams once separated are not combined again, but lenses are disposed in their respective optical axes for compensating for variances in magnifications due to chromatic aberration and one-dimensional linear image sensors are disposed at the positions of the real images formed by the respective beams. By virtue of such arrangement, the man-hour for adjustments has been largely reduced and stability after the adjustment has become remarkably improved.

What is claimed is:

1. An apparatus, in a reduction-projection exposure apparatus, for reduction-projection position detection comprising:
    illumination means for illuminating a registration mark on a specimen with at least three wavelengths of laser beams oscillated in an Ar laser and at least one wavelength which is different from said at least three wavelengths, of at least one laser beam oscillated in a He-Ne laser passed through a reduction-projection lens;
    an image forming optical system condensing, through the reduction-projection lens, reflected beams from the registration mark on the specimen illustrated by said illumination means and separating the beam into beams of at least four wavelengths, at least, out of said wavelengths, for forming images of the separated beams; and
    image pick-up means for picking up the images, formed by said image forming optical system, thereby to detect the position of the registration mark.

2. An apparatus for reduction-projection position detection according to claim 1, wherein the at least four wavelengths are 458, 488, 515, and 543 nm.

3. An apparatus for reduction-projection position detection according to claim 1, wherein said image forming optical system is provided with optical elements disposed in respective optical paths of the beams separated into those of four wavelengths for equalizing the image forming magnifications in all of the wavelengths.

4. An apparatus for reduction-projection position detection according to claim 1, wherein said image pick-up means are provided in numbers more than one disposed at shifted focusing positions in order that the detection is performed in plural directions and said image forming optical system includes branches of optical systems in order that the image formation is achieved on each of said image pick-up means.

5. An apparatus, in a reduction-projection exposure apparatus, for reduction-projection position detection comprising:
illumination means for illuminating a registration mark on a specimen with at least three wavelengths of laser beams oscillated in an Ar laser and at least one wavelength which is different from said at least three wavelengths, of at least one wavelength oscillated in a He-Ne laser passed through a reduction-projection lens;
an image forming optical system condensing through the reduction-projection lens, reflected beams from the registration mark on the specimen illustrated by said illumination means and separating the beams into beams of at least four wavelengths, at least, out of said wavelengths, and further, having optical paths of the separated beams bent by means of combinations of mirrors so as to change lengths of the optical paths thereof, for forming images of the separated beams on the same plane; and
image pick-up means for picking up the images, formed by said image forming optical system, thereby to detect the position of the registration mark.

6. An apparatus for reduction-projection position detection according to claim 5, wherein the at least four wavelengths are 458, 488, 515, and 543 nm.

7. An apparatus for reduction-projection position detection according to claim 5, wherein said image forming optical system is provided with optical elements disposed in the respective optical paths of the beams separated into those of the at least four wavelengths for equalizing image forming magnifications in all of the wavelengths.

8. An apparatus for reduction-projection position detection according to claim 5, wherein said image pick-up means are provided in numbers more than one disposed at shifted focusing positions in order that the detection is performed in plural directions and said image forming optical system includes branches of optical systems in order that the image formation is achieved on each of said image pick-up means.

9. An apparatus, in a reduction-projection exposure apparatus, for reduction-projection position detection comprising:
illuminating means for illuminating a registration mark on a specimen with three or four wavelengths of laser beams oscillated in an Ar laser and one or two wavelengths, which are different from said wavelengths, of laser beams oscillated in a He-Ne laser passed through a reduction-projection lens;
an image forming optical system condensing, through the reduction-projection lens, reflected beams from the registration mark on the specimen illustrated by said illuminating means and separating the beams into beams of four wavelengths, at least, out of said wavelengths, for forming first real images in the respective optical paths for the separated wavelengths at the back of the reduction-projection lens, and then, compensating for differences in magnifications of the first real images corresponding to the respective wavelengths, for each of the wavelengths, and magnifying the images, for forming second real images;
a plurality of image pick-up elements for picking up the second images for individual wavelengths to convert the same into picture signals; and
summing means for summing up the outputs of said image pick-up elements.

10. An apparatus for reduction-projection position detection according to claim 9, wherein said image forming optical system is provided with relay lenses for forming the first real images at the back of the reduction-projection lens.

11. An apparatus for reduction-projection position detection according to claim 9, wherein the four wavelengths are 458, 488, 515, and 543 nm.

12. A method, in a method for reduction-projection exposure, for reduction-projection position detection comprising the steps of illuminating a registration mark on a specimen with laser beams of four wavelengths, at least, passed through a reduction-projection lens by means of illuminating means, condensing a reflected beam from the registration mark on the specimen through the reduction-projection lens, separating the beam into beams of four wavelengths, at least, by means of separating means, forming respective images for the separate beams by means of an image forming optical system, and converting the formed images of the registration mark into picture signals by means of image pick-up means, thereby to detect the position of the registration mark.

* * * * *